(12) United States Patent
Cunningham et al.

(10) Patent No.: US 8,131,119 B2
(45) Date of Patent: Mar. 6, 2012

(54) OPTICAL DEVICE WITH LARGE THERMAL IMPEDANCE

(75) Inventors: John E. Cunningham, San Diego, CA (US); Ashok V. Krishnamoorthy, San Diego, CA (US); Ivan Shubin, San Diego, CA (US); Guoliang Li, San Diego, CA (US); Xuezhe Zheng, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 0 days.

(21) Appl. No.: 12/845,035

(22) Filed: Jul. 28, 2010

(65) Prior Publication Data
US 2010/0290736 A1    Nov. 18, 2010

Related U.S. Application Data

(63) Continuation of application No. 12/415,858, filed on Mar. 31, 2009, now Pat. No. 7,848,599.

(51) Int. Cl.
*G02B 6/10* (2006.01)
*G02B 6/12* (2006.01)
*G02B 6/26* (2006.01)
*G02B 6/42* (2006.01)

(52) U.S. Cl. .......... 385/1; 385/14; 385/28; 385/30; 385/129

(58) Field of Classification Search .......... 385/1–3, 385/14, 28, 30, 129–132
See application file for complete search history.

(56) References Cited

U.S. PATENT DOCUMENTS

| | | | |
|---|---|---|---|
| 2004/0037497 A1* | 2/2004 | Lee | 385/28 |
| 2006/0198416 A1* | 9/2006 | Yamazaki | 372/94 |
| 2008/0080803 A1 | 4/2008 | Park | |
| 2009/0103858 A1* | 4/2009 | Ohtsu et al. | 385/14 |

* cited by examiner

*Primary Examiner* — Charlie Peng
*Assistant Examiner* — Jerry Blevins
(74) *Attorney, Agent, or Firm* — Park, Vaughan, Fleming & Dowler LLP; Anthony P. Jones

(57) ABSTRACT

Embodiments of an optical device, an array of optical devices, and a technique for fabricating the optical device or the array are described. This optical device is implemented on a substrate (such as silicon), and includes a thermally tunable optical waveguide that has good thermal isolation from its surroundings. In particular, a portion of a semiconductor in the optical device, which includes the optical waveguide, is free standing above a gap between the semiconductor layer and the substrate. By reducing the thermal coupling between the optical waveguide and the external environment, the optical device can be thermally tuned with significantly less power consumption.

20 Claims, 12 Drawing Sheets

OPTICAL DEVICE WITH LARGE THERMAL IMPEDANCE

RELATED APPLICATIONS

This application is a continuation of, and hereby claims priority under 35 U.S.C. §120 to, pending U.S. patent application Ser. No. 12/415,858, entitled "Optical Device with Large Thermal Impedance," by inventors John E. Cunningham, Ashok V. Krishnamoorthy, Ivan Shubin, GuoLiang Li and Xuezhe Zheng, filed on 31 Mar. 2009.

This application is related to pending U.S. patent application Ser. No. 12/415,882, entitled "Thermal Tuning of an Optical Device," by GuoLiang Li, Ashok V. Krishnamoorthy, John E. Cunningham, Ivan Shubin and Xuezhe Zheng, filed on 31 Mar. 2009, the contents of which are herein incorporated by reference. This application is also related to pending U.S. patent application Ser. No. 12/415,886, entitled "Dual-Layer Thermally Tuned Optical Device," by GuoLiang Li, John E. Cunningham, Ashok V. Krishnamoorthy, Ivan Shubin and Xuezhe Zheng, filed on 31 Mar. 2009, the contents of which are herein incorporated by reference.

GOVERNMENT LICENSE RIGHTS

This invention was made with Government Support under Agreement No. HR0011-08-9-0001 awarded by DARPA. The Government has certain rights in the invention.

BACKGROUND

1. Field of the Invention

The present invention relates to techniques for communicating optical signals. More specifically, the present invention relates to an optical device with a thermally tunable optical waveguide.

2. Related Art

Wavelength division multiplexing (WDM) is widely used to communicate modulated data at different carrier wavelengths on a common optical waveguide. WDM can overcome optical-fiber congestion, which is a potential problem in optical modules that include parallel optical transceivers with one channel per optical fiber. In particular, by significantly reducing the number of optical fibers per optical module, WDM multiplexing can simplify optical modules, thereby reducing their cost and size.

In dense WDM (DWDM), a narrow spacing between adjacent wavelengths is used. This is typically achieved by modulating data directly onto a highly stable optical carrier, and then combining multiple carriers in an optical fiber. DWDM allows a large number of channels to be accommodated within a given wavelength band, and thus offers high performance.

In DWDM, a variety of optical devices are used as: modulators, multiplexers (such as add filters), de-multiplexers (such as drop filters), filters and switches. In order to compensate for fabrication variation, temperature variation and/or laser wavelength drift, these optical devices are typically phase-tuned to a particular wavelength for a given channel. Depending on the system requirements, a tuning range of at least 180° may be needed.

Thermal tuning is a popular tuning technique because it provides the ability to produce large phase shifts. Existing thermal tuning techniques include direct heating (which is implemented by doping in an optical waveguide) and indirect heating (in which a heater is proximate to the optical waveguide). Typically, the direct-heating technique is more energy-efficient than indirect heating, but it can prevent the optical waveguide from performing additional functions (because of the constraint on the doping density), and it can introduce additional optical losses due to free-carrier absorption (which can degrade the quality factor of an optical resonator).

In principle, optical devices can be made on silicon substrates, because silicon provides many benefits for optical communication. For example, the high index-of-refraction contrast between silicon and silicon dioxide can be used to create sub-micron waveguides to confine light with spatial densities that are up to 100× larger than in a single-mode optical fiber. Furthermore, by using a silicon-on-insulator (SOI) technology, a silicon waveguide can be surrounded by silicon dioxide on all four sides, which facilitates low-loss, on-chip waveguides and active devices (such as detectors and modulators). Silicon-based optical devices can be used to implement a wide variety of optical components for use in WDM communication. These silicon-based optical devices offer numerous advantages, including: miniaturization, low-energy modulation, the ability to integrate with other devices in silicon, and/or the ability to leverage the large, existing silicon manufacturing infrastructure.

Unfortunately, there are problems associated with silicon-based optical devices. A notable problem is the high thermal conductivity of silicon. While this helps remove the heat dissipated by electrical circuits, it can make it more difficult to thermally tune a silicon-based optical device. In particular, because the operating wavelength of a silicon-based optical device (such as the resonant wavelength of an optical resonator) strongly depends on temperature, the operating wavelength is typically tuned using either direct or indirect heating to change the operating temperature of the silicon-based optical device. However, the high thermal conductivity of silicon results in excessive thermal coupling to the surrounding environment. Consequently, thermal tuning of silicon-based optical devices often consumes a disproportionately large amount of energy (typically, 50-100 mW for a phase shift of 180°). This high power consumption can offset the advantages provided by silicon, and makes it more difficult to use silicon-based optical devices to implement optical communication (such as WDM) in computing systems (especially in systems that have multiple instances of the optical devices).

Hence, what is needed is an optical device that can be thermally tuned without the above-described problems.

SUMMARY

One embodiment of the present invention provides an optical device that includes: a substrate, an intermediate layer deposited on the substrate, and a semiconductor layer deposited on the intermediate layer. This semiconductor layer includes a thermally tunable optical waveguide and one or more vias that extend from a top of the semiconductor layer to a bottom of the semiconductor layer which is proximate to the intermediate layer. A portion of the semiconductor layer is free standing above a gap between the semiconductor layer and the substrate, where the gap corresponds to a removed sacrificial portion of the intermediate layer, which was accessed through the one or more vias. This gap increases thermal impedance between the semiconductor layer and the substrate, thereby reducing power consumption associated with thermal tuning of the optical waveguide. Moreover, another portion of the semiconductor layer is supported by a remaining portion of the intermediate layer.

Note that the substrate may include silicon, the intermediate layer may include an oxide (such as silicon dioxide)

and/or the semiconductor layer may include silicon. For example, the substrate, the intermediate layer and the semiconductor layer may comprise a silicon-on-insulator (SOI) technology.

In some embodiments, air is at least partially removed from the gap.

Furthermore, the optical device may include a heater defined in the semiconductor layer (which may be in or proximate to the optical waveguide). For example, the heater may include a passive resistor or an active device. This heater may be used to thermally tune the optical waveguide. Note that power consumption by the heater may be less than 10-20 mW for a 180° phase shift in the optical waveguide.

Additionally, the optical device may include one or more electrical couplings between the semiconductor layer and one or more power-supply contacts through one or more bridges over the gap. However, in other embodiments, the one or more electrical couplings between the semiconductor layer and the one or more power-supply contacts occur in the remaining portion of the intermediate layer.

In some embodiments, the optical waveguide is included in: an optical filter, an optical multiplexer and/or an optical de-multiplexer.

Another embodiment provides an array with multiple instances of the optical device. In this embodiment, the gap in a given optical device increases thermal impedance to other instances of the optical device. Moreover, the heater in the given optical device may facilitate programming the temperature in the given optical device, which can be different from the temperature in one or more other instances of the optical device.

Another embodiment provides a method for fabricating an optical device. During this method, a thickness of a semiconductor layer in a tri-layer structure, which includes a substrate, an intermediate layer deposited on the substrate, and a semiconductor layer deposited on the intermediate layer, is reduced. Then, one or more vias that extend from a top of the semiconductor layer to a bottom of the semiconductor layer, which is proximate to the intermediate layer, are opened. Next, a sacrificial portion of the intermediate layer is removed so that a portion of the semiconductor layer is free standing above a gap between the semiconductor layer and the substrate. Note that another portion of the semiconductor layer is supported by a remaining portion of the intermediate layer. Moreover, a thermally tunable optical waveguide in the semiconductor layer, which is substantially positioned above the gap, is defined, thereby reducing power consumption associated with thermal tuning of the optical waveguide.

BRIEF DESCRIPTION OF THE FIGURES

Note that like reference numerals refer to corresponding parts throughout the drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of an optical device, an array of optical devices, and a technique for fabricating the optical device or the array are described. This optical device is implemented on a substrate (such as silicon), and includes a thermally tunable optical waveguide with a high thermal resistance to the surrounding external environment and a low thermal resistance to a localized heater. In particular, the thermal resistances associated with thermal dissipation paths from a heater in the optical device to an external environment via electrodes and via the substrate are increased, while the thermal resistance between the optical waveguide and the heater is decreased.

By reducing the thermal coupling between the optical waveguide and the external environment, the optical device can be thermally tuned with significantly less power consumption than existing silicon-based optical devices (for example, 10-100× less power consumption). This reduction in power consumption may facilitate systems that use DWDM with a channel spacing of approximately 50 GHz, as well as high-performance computing systems that include optical interconnects. Moreover, in these systems, the optical device may: reduce the number of components, reduce the cost, and/or increase reliability.

We now describe embodiments of an optical device that includes an optical waveguide. Thermal tuning of an optical waveguide, which is implemented on silicon, is often based on the increase in the index of refraction of silicon with temperature. By changing the temperature in the optical waveguide, the index of refraction, as well as the optical phase (which is proportional to the index of refraction) of the propagating laser light in the optical waveguide, can be tuned.

In order to achieve efficient thermal tuning, the temperature change in the optical waveguide needs to be maximized for the available heater power.

Figure 1:
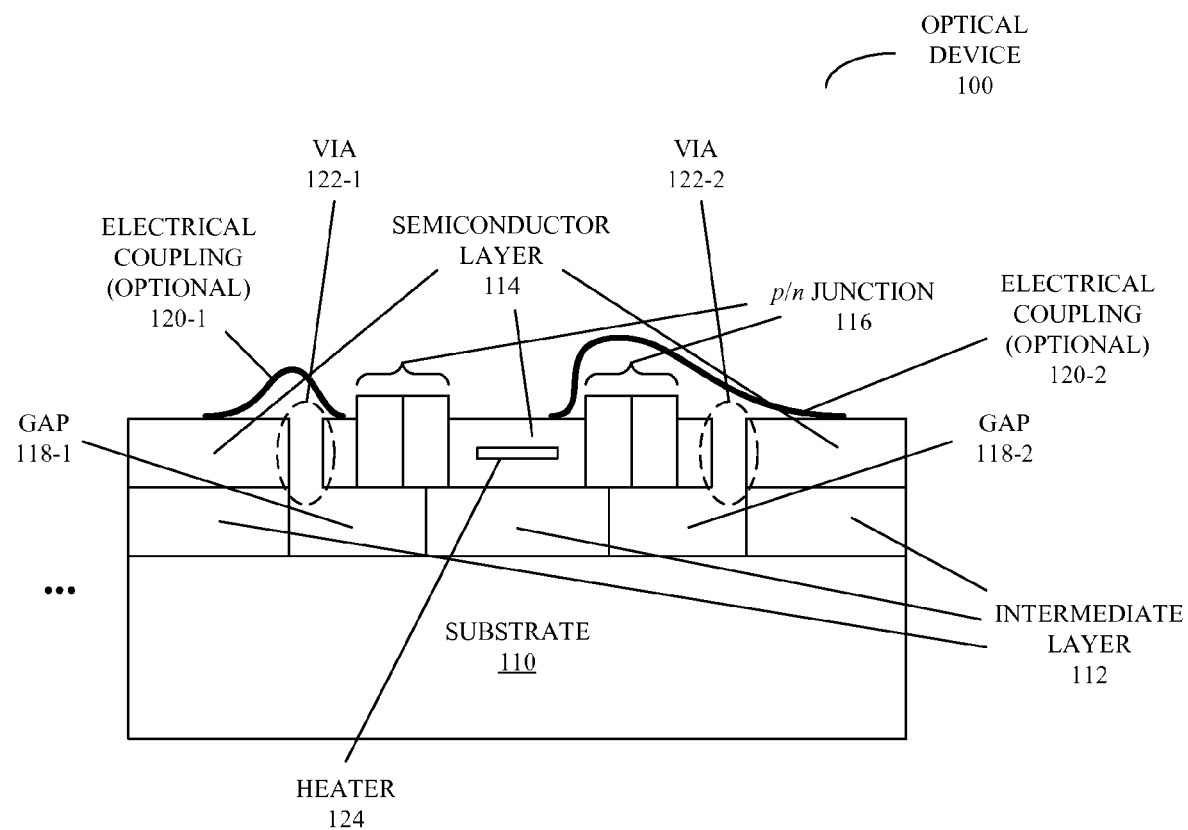
FIG. 1 is a block diagram illustrating a tunable optical device in accordance with an embodiment of the present invention.
Figure 2:
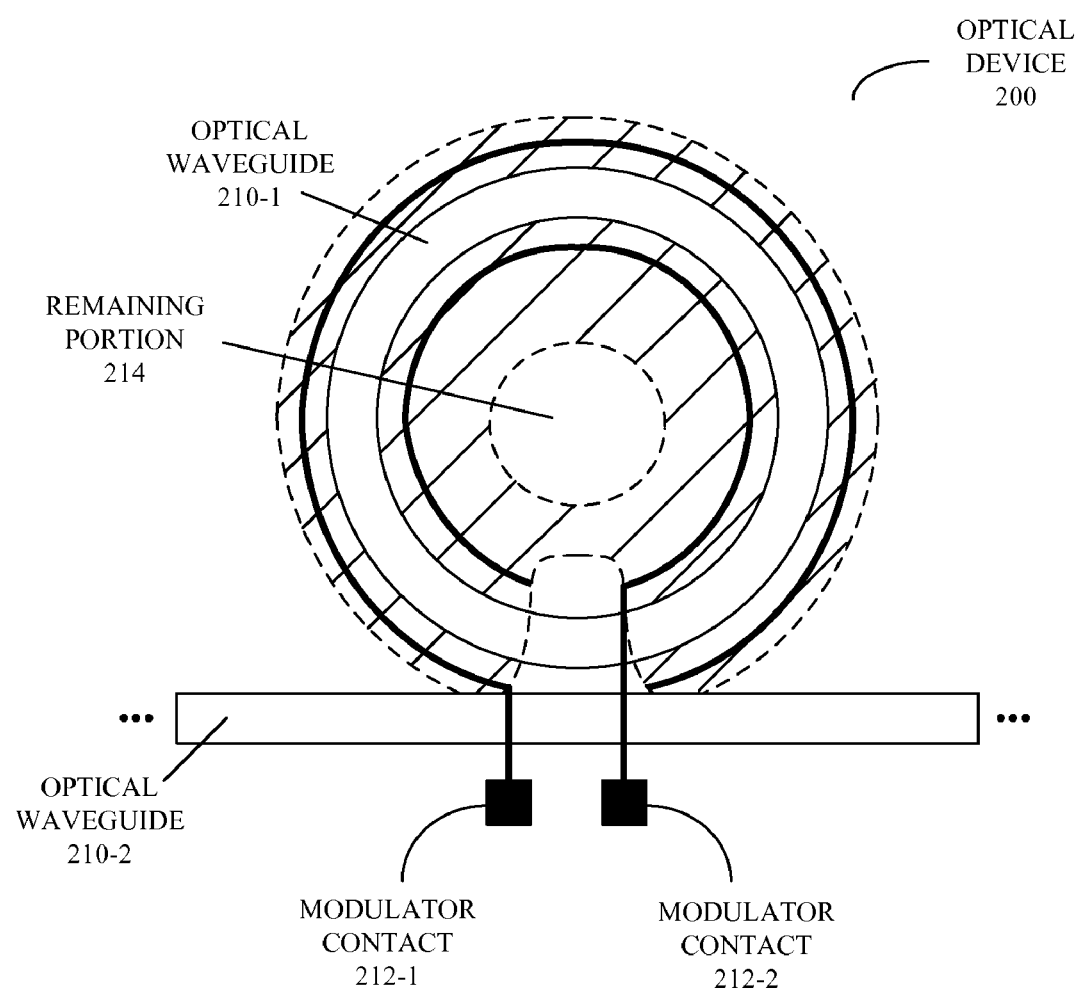
FIG. 2 is a block diagram illustrating a tunable optical device in accordance with an embodiment of the present invention.

FIG. 1 presents a block diagram illustrating a cross-sectional view of a tunable optical device 100. This optical device includes: a substrate 110, an intermediate layer 112 deposited on the substrate 110, and a semiconductor layer 114 deposited on the intermediate layer 112. This semiconductor layer includes a thermally tunable resonant optical waveguide, as illustrated by p/n junction 116. (As shown in FIG. 2, the optical waveguide may be implemented in a ring-modulator configuration, so the two portions of p/n junction 116 shown in FIG. 1 are actually part of one continuous structure.) A resonant wavelength of this optical waveguide is a function of the temperature of p/n junction 116. This optical waveguide may be included in a variety of optical components, such as: an optical filter, an optical multiplexer, an optical de-multiplexer and an optical add/drop.

In optical device 100, intermediate layer 112 is partially etched to produce one or more gaps 118 between the semiconductor layer 114 and the substrate 110. For example, the one or more gaps 118 may be fabricated by removing a sacrificial portion of the intermediate layer 112. This sacrificial portion may be removed using a chemical-etch process that accesses the intermediate layer 112 through one or more vias 122 that extend from a top of the semiconductor layer 114 to a bottom of the semiconductor layer 114 which is proximate to the intermediate layer 112.

Consequently, a portion of the semiconductor layer 114 is undercut and is free standing above the one or more gaps 118, and a central portion of the semiconductor layer 114 is supported by a remaining, central portion of the intermediate layer 112. Note that the one or more gaps 118 reduce thermal coupling between the semiconductor layer 114 and the substrate 110. If a heater 124 is implemented in the optical waveguide or proximate to the optical waveguide on the free-standing portion of the semiconductor layer 114, the power consumption associated with thermal tuning of the optical waveguide is reduced because the thermal impedance of the one or more gaps 118 is larger (10× or more) than the thermal impedance of the intermediate layer 112 (which allows a greater temperature difference to be applied and maintained across this interface). For example, power consumption by the heater may be less than 20 mW for a 180° phase shift in the optical waveguide (which is at least 2.5-5× lower than existing optical devices).

In an exemplary embodiment, the substrate 110 includes silicon, the intermediate layer 112 includes an oxide (such as silicon dioxide), and/or the semiconductor layer 114 includes silicon. Therefore, the substrate 110, the intermediate layer 112 and the semiconductor layer 114 may comprise a silicon-on-insulator (SOI) technology. Furthermore, the silicon semiconductor layer 114 may be 0.5 µm thick and the silicon-dioxide intermediate layer may have a thickness between 0.001 and 10 µm. In addition, the sidewalls of the one or more gaps 118 may be thermally oxidized to avoid scattering losses.

Note that air in the one or more gaps 118 has a much lower thermal conductivity (approximately 0.02 W/m-K) compared to silicon dioxide (1.4 W/m-K), which can reduce the heat dissipation to substrate 110 by a factor of 10×. In some embodiments, air is at least partially removed from the one or more gaps 118 to further increase the thermal impedance. For example, a soft-vacuum may be achieved using a getter, and by subsequently sealing the one or more vias 122.

Electrical connections to the heater 124 and/or the optical waveguide may be implemented using one or more optional air-bridge electrical couplings 120 between the central portion of the semiconductor layer 114 and one or more power-supply contacts (which are shown in FIGS. 2 and 3). However, in other embodiments, the one or more electrical connections between the central portion of the semiconductor layer 114 and the one or more power-supply contacts may occur in the remaining, central portion of the intermediate layer 112. For example, heater 124 (such as a passive resistor or an active device) may be situated in this remaining, central portion of the intermediate layer 112. This non-undercut area has a low thermal impedance to the optical waveguide, and a high impedance to the external environment of optical device 100.

In some embodiments, resistive heating is implemented inside the optical waveguide (instead of using a heater, such as heater 124, which is in close proximity to the optical waveguide). For example, one or more heating elements may be integrated in the optical waveguide and a controlled amount of current may be sourced from a tuning circuit to these heating elements. However, doping the optical waveguide to implement the one or more heating elements may increase optical losses due to free-carrier absorption, which can degrade the quality factor of a resonator device.

Note that optical device 100 may include multiple instances of the structure shown in FIG. 1. For example, there may be an array of optical waveguides implemented in the semiconductor layer 114, each of which is at least partially thermally isolated from the substrate 110 by gaps (such as the one or more gaps 118). In this case, these gaps will also reduce thermal coupling between the optical waveguides in the array, thereby reducing or eliminating thermal cross-talk.

Moreover, the temperatures of the optical waveguides in the array may be individually programmed, so that one or more optical waveguides can have different temperatures than other optical waveguides in the array. Therefore, in an array of optical waveguides (or more generally, optical components), heaters and/or heating elements may be used to produce arbitrary, programmable thermal profiles across the array or to create the necessary tuning, modulation and/or other functionality. Once the heaters or heating elements are turned on, the power to each may be chosen to increase the temperature of each resonant device by the appropriate amount to achieve an operating temperature in the desired range. Moreover, the temperature control mechanism may include biased temperature control.

In some operating conditions, the absolute wavelength range of the array may experience drift. This can occur if the ambient temperature changes or if there is some global change in the temperature of the substrate 110. However, even in this situation, active thermal management of the resonant wavelengths of the optical waveguides will still produce and maintain the correct wavelengths as long as the chip does not experience thermal runaway. This possibility can be substantially mitigated if active cooling is also used to control and maintain the global temperature of the substrate 110 at a pre-determined level.

FIG. 2 presents a block diagram illustrating a top view of a tunable optical device 200, which includes optical waveguides 210. Optical waveguide 210-1 is situated above a gap (shown by the hatched region) and is supported by a remaining portion 214 of the intermediate layer 112 (FIG. 1). Note that the intermediate layer 112 (FIG. 1) in this embodiment is etched on three of four sides of the remaining portion 214.

Operating bias for optical waveguide 210-1 may be provided by highly doped, low-resistance electrical modulator contacts 212 via air-bridge electrical couplings, such as optional electrical couplings 120 (FIG. 1). Note that these modulator contacts can also be used to conduct heat and/or current from a chip that includes one or more waveguides to associated laser elements.

Figure 3A:
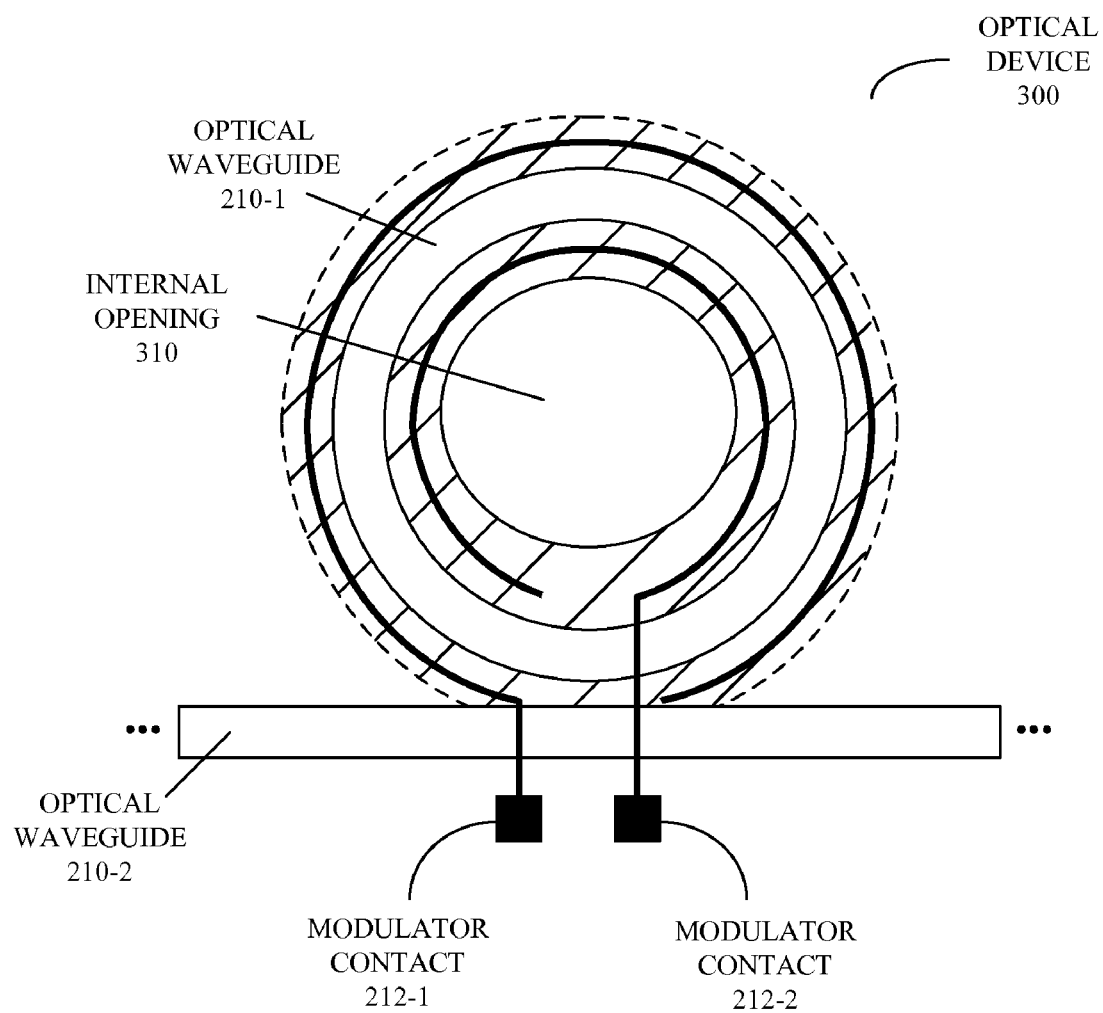
FIG. 3A is a block diagram illustrating a tunable optical device in accordance with an embodiment of the present invention.
Figure 3B:
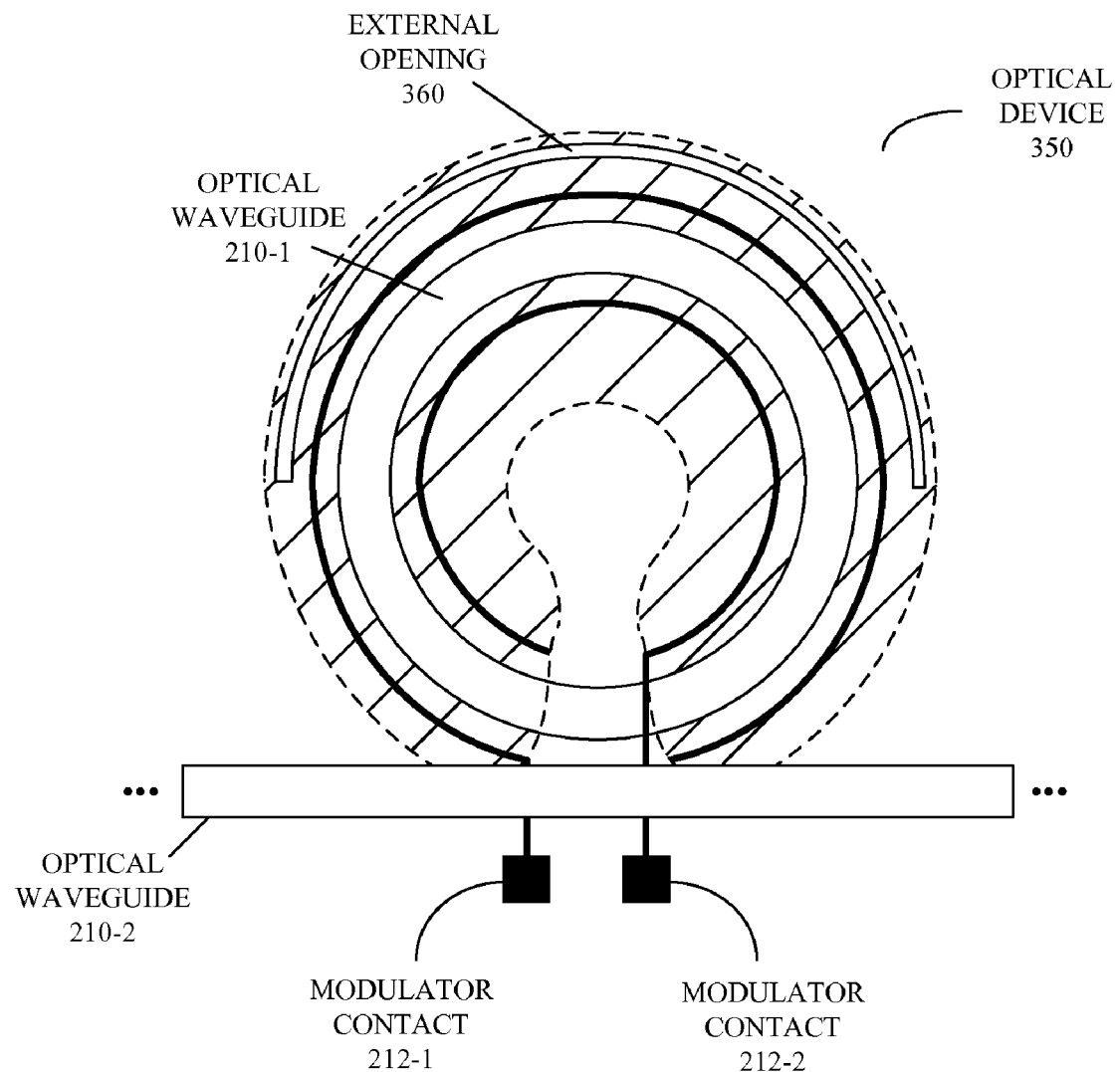
FIG. 3B is a block diagram illustrating a tunable optical device in accordance with an embodiment of the present invention.

A variety of configurations may be used for the one or more vias 122 (FIG. 1), which facilitate partial etching of the intermediate layer 112 (FIG. 1). In some embodiments, the vias (or openings) are implemented in the substrate 110 (FIG. 1). FIG. 3A presents a block diagram illustrating a bottom view of a tunable optical device 300 with an internal opening 310, and FIG. 3B presents a block diagram illustrating a bottom view of a tunable optical device 350 with an external opening 360. These openings may be fabricated by dry etching a silicon substrate to a thickness between 0.1 and 0.5 µm. Then, the openings may be created by removing the silicon to expose a portion of the intermediate layer 112 (FIG. 1).

Internal opening 310 (FIG. 3A) may provide a more symmetric undercut, and may avoid a discontinuity in the optical waveguide (cladding/no cladding), which may reduce optical losses. However, external opening 360 may offer a larger thermal impedance between the substrate 110 (FIG. 1) and the semiconductor layer 114 (FIG. 1). Both of the opening configurations may allow electrical connections to be routed without air bridges.

In optical devices, such as optical device 100 (FIG. 1), there are typically three heat dissipation paths: a first path dissipates heat through the active semiconductor layer 114 (FIG. 1) to the electrical connections; a second path dissipates heat through the intermediate layer 112 (FIG. 1) to the substrate 110 (FIG. 1); and a third path dissipates heat through a top layer above the semiconductor layer 114 (FIG. 1) to the air (which is typically negligible). Note that the temperature change in the optical waveguide is proportional to the thermal impedance of all of the heat dissipation paths. Because the third path is typically negligible, in order to maximize the temperature change, the thermal impedances of the first and second paths need to be increased.

Optical device 100 (FIG. 1) provided a technique for increasing the thermal impedance of the second path. We now describe additional techniques for increasing the thermal impedance of the first and the second paths, which may be used separately and/or in conjunction with each other, as well as with the technique shown in FIG. 1. By combining all of these techniques, the thermal impedance between the optical waveguide in the optical device and the external environment may be increased by over an order of magnitude. This can reduce the power consumed during tuning of the optical waveguide by an order of magnitude. In addition, optical losses in the optical waveguide due to free-carrier absorption can also be reduced by more than 4×. Consequently, these techniques can significantly reduce the power budget for silicon-based optical devices in WDM systems and computing systems that include optical interconnects.

Figure 4:
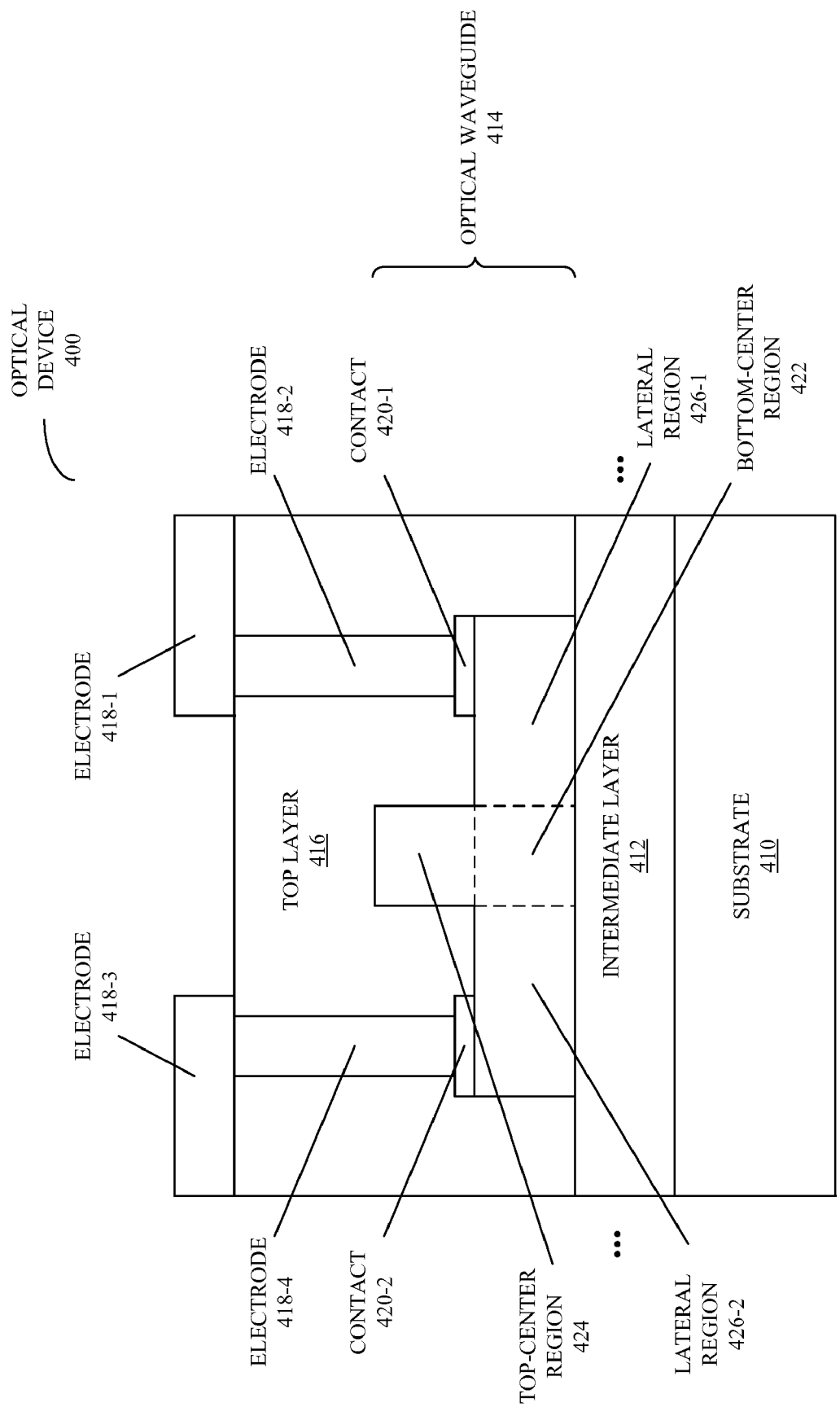
FIG. 4 is a block diagram illustrating a tunable optical device in accordance with an embodiment of the present invention.

FIG. 4 presents a block diagram illustrating a cross-sectional view of a tunable optical device 400. This optical device includes: a substrate 410, an intermediate layer 412 deposited on the substrate 410, a semiconductor layer (which includes a thermally tunable optical waveguide 414) deposited on the intermediate layer 412, and a top layer 416 deposited on the semiconductor layer. This top layer includes one or more vias from an upper surface of the top layer 416 to a bottom surface of the top layer 416, which is proximate to the semiconductor layer. Moreover, optical device 400 includes electrodes 418, deposited on the top layer 416 and in the one or more vias, which electrically couple to optical waveguide 414 in the semiconductor layer through contacts 420.

A thermal impedance of the first path may be increased by using a material in portions of the electrodes 418-2 and 418-4 which has a lower thermal conductivity (i.e., a higher thermal impedance) than a remainder of the electrodes 418-1 and 418-3, thereby reducing the power consumption associated with thermal tuning of the optical waveguide 414 by reducing thermal coupling from an external environment to the optical waveguide 414. For example, portions of the electrodes 418-2 and 418-4 may include indium-tin-oxide (ITO), or another material with a high electrical conductivity and a low thermal conductivity. ITO is highly conductive, optically transparent, and has a very low thermal conductivity (less than 10 W/m-K, compared with 163 W/m-K for silicon and 401 W/m-K for copper). This can potentially increase the thermal impedance in the first path more than 10×.

Note that the intermediate layer 412 and the top layer 416 may be electrical insulators and dielectric materials that have a low optical index of refraction and a low thermal conductivity. Moreover, the substrate 410, the intermediate layer 412 and the semiconductor layer may comprise a SO/technology.

Additionally, the semiconductor layer in a central region of the optical waveguide 414 may be doped (for example, using implantation) to define a heater that facilitates thermal tuning of the optical waveguide 414. (Alternatively, a separate heater, such as heater 124 in FIG. 1, may be used.) Power consumption by the heater may be less than 10-20 mW for a 180° phase shift in the optical waveguide.

In some embodiments, doping of the central region of the semiconductor layer in the optical waveguide 414 (such as a region defined by the approximate lateral extent of an evanescent wave) may be less than the doping of the semiconductor layer in lateral regions 426 surrounding the optical waveguide 414, thereby reducing optical losses in the optical waveguide 414 and reducing heat dissipation along the second path. For example, doping in bottom-center region 422 and top-center region 424 may be $10^{17}/cm^3$ and doping in the lateral regions 426 may be $10^{18}/cm^3$. However, in some embodiments, the bottom-center region 422 (but not the top-center region 424) of the optical waveguide 414 is doped, thereby further reducing optical losses in the optical waveguide 414. Note that the central regions of optical waveguide 414 may be 0.5 µm wide and the lateral regions 426 may 2 µm wide.

Figure 5:
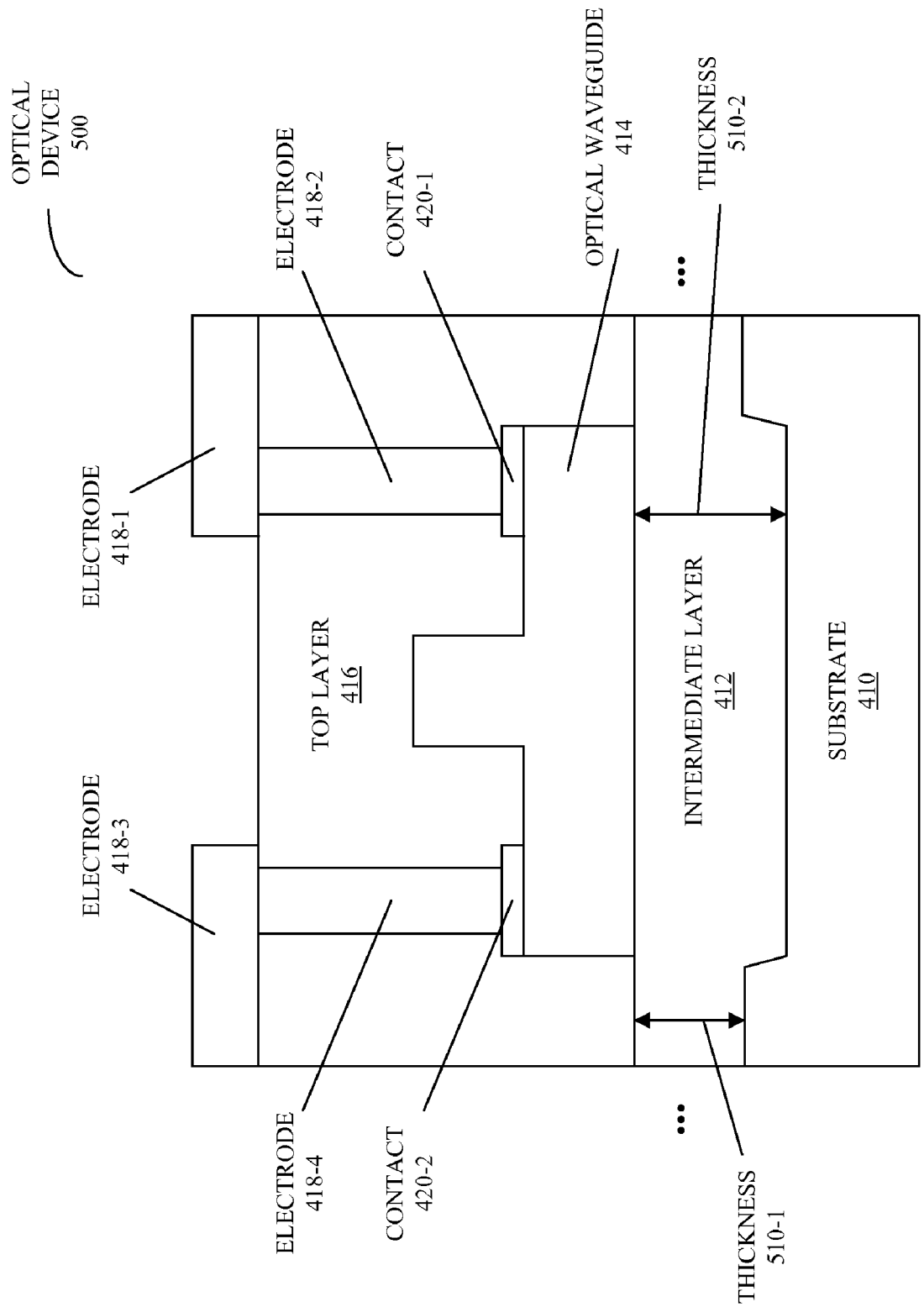
FIG. 5 is a block diagram illustrating a tunable optical device in accordance with an embodiment of the present invention.

As shown in FIG. 5, which presents a block diagram illustrating a cross-sectional view of tunable optical device 500, in some embodiments a thickness 510-2 of the intermediate layer 412 is thicker under the optical waveguide 414 than a thickness 510-1 of lateral regions of the intermediate layer 412. By increasing the thickness, the thermal impedance of the second path may be increased. Note that the thickness may be increased by implanting oxygen atoms into the silicon substrate 410 underneath the optical waveguide 414. Then, a layer of the substrate 410 may be thermally oxidized to increase the thickness 510-2.

Figure 6A:
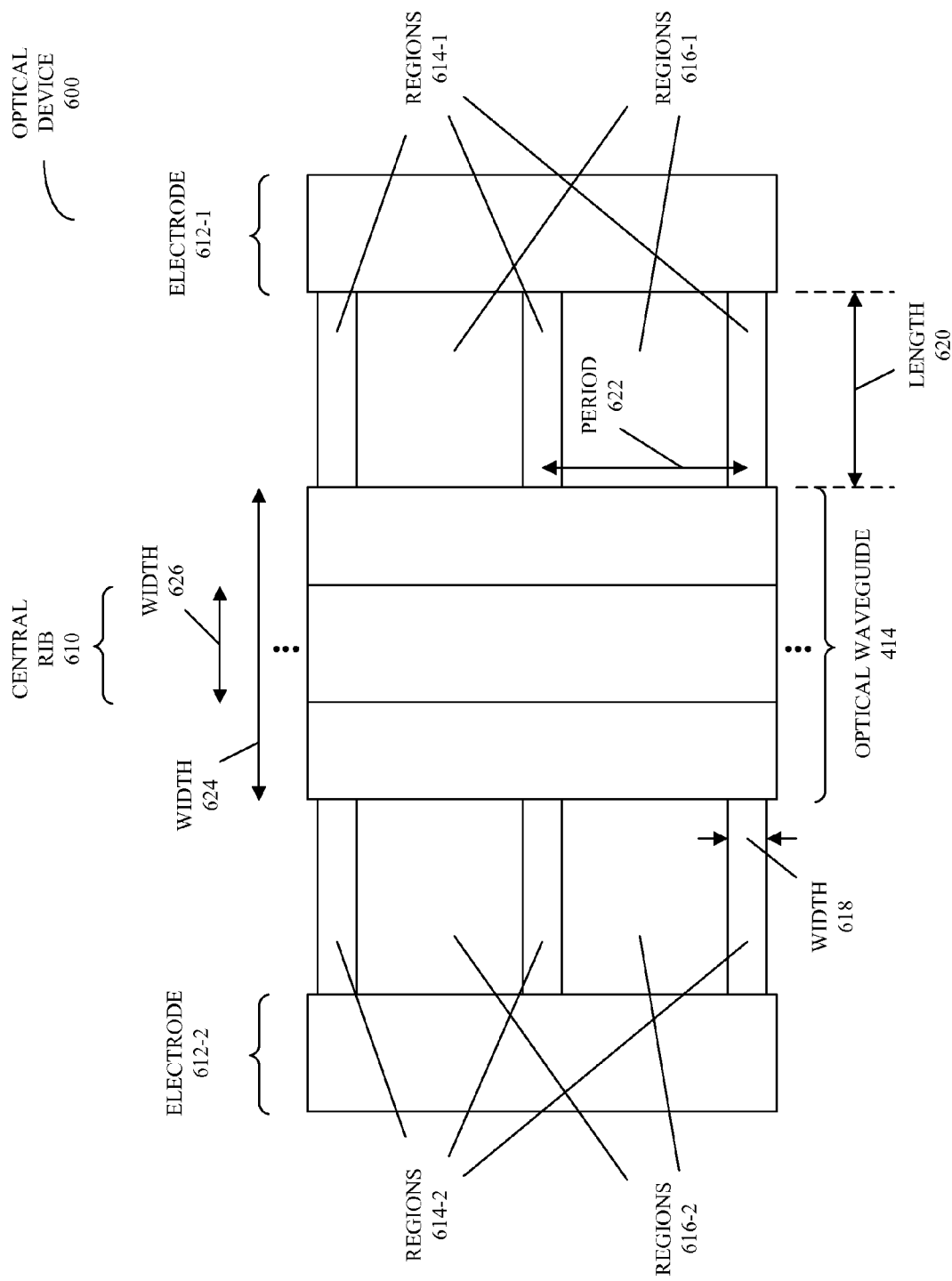
FIG. 6A is a block diagram illustrating a tunable optical device in accordance with an embodiment of the present invention.

FIG. 6A presents a block diagram illustrating a top view of a tunable optical device 600. In this optical device, optical waveguide 414 (which includes a central rib 610 having width 626, and a total width 624) is thermally coupled to electrodes 612 by multiple regions 614 in the semiconductor layer which have a higher electrical conductivity than additional regions 616 that are interdigited with the regions 614. In materials other than indium-tin oxide, this higher electrical conductivity is often accompanied by higher thermal conductivity. To address this, in some embodiments the electrode material(s) and/or shape(s) are selected to reduce the thermal conductivity without significantly increasing the electrode resistance.

Regions 614 may have a symmetry axis or a principal axis (through the center of mass) that is approximately perpendicular (for example, within 15° of perpendicular) to a symmetry axis or a principal axis (through the center of mass) of the optical waveguide 414 in a plane of the semiconductor layer. While regions 614 are illustrated with rectangular regions, in other embodiments a variety of shapes, such as zig-zag lines and/or non-symmetric shapes may be used.

Regions 614 in the semiconductor layer may have a higher doping than regions 616 and the optical waveguide 414. In an exemplary embodiment, regions 614 have a 10× larger doping, such as $10^{20}/cm^3$. Moreover, a width 618 of the regions 614 may be at least five times smaller than a period 622 of the regions 614. In an exemplary embodiment, regions 614 have a thickness of 0.1 µm, a width 618 of 1 µm, and a length 620 between 2 and 3 µm. Furthermore, there may be a spacing of 9 µm between adjacent regions 614. This configuration may increase the thermal resistance in the first path by an order of magnitude, and it may increase the thermal resistance in the second path as well (due to reduced area for downward heat conduction).

Figure 6B:
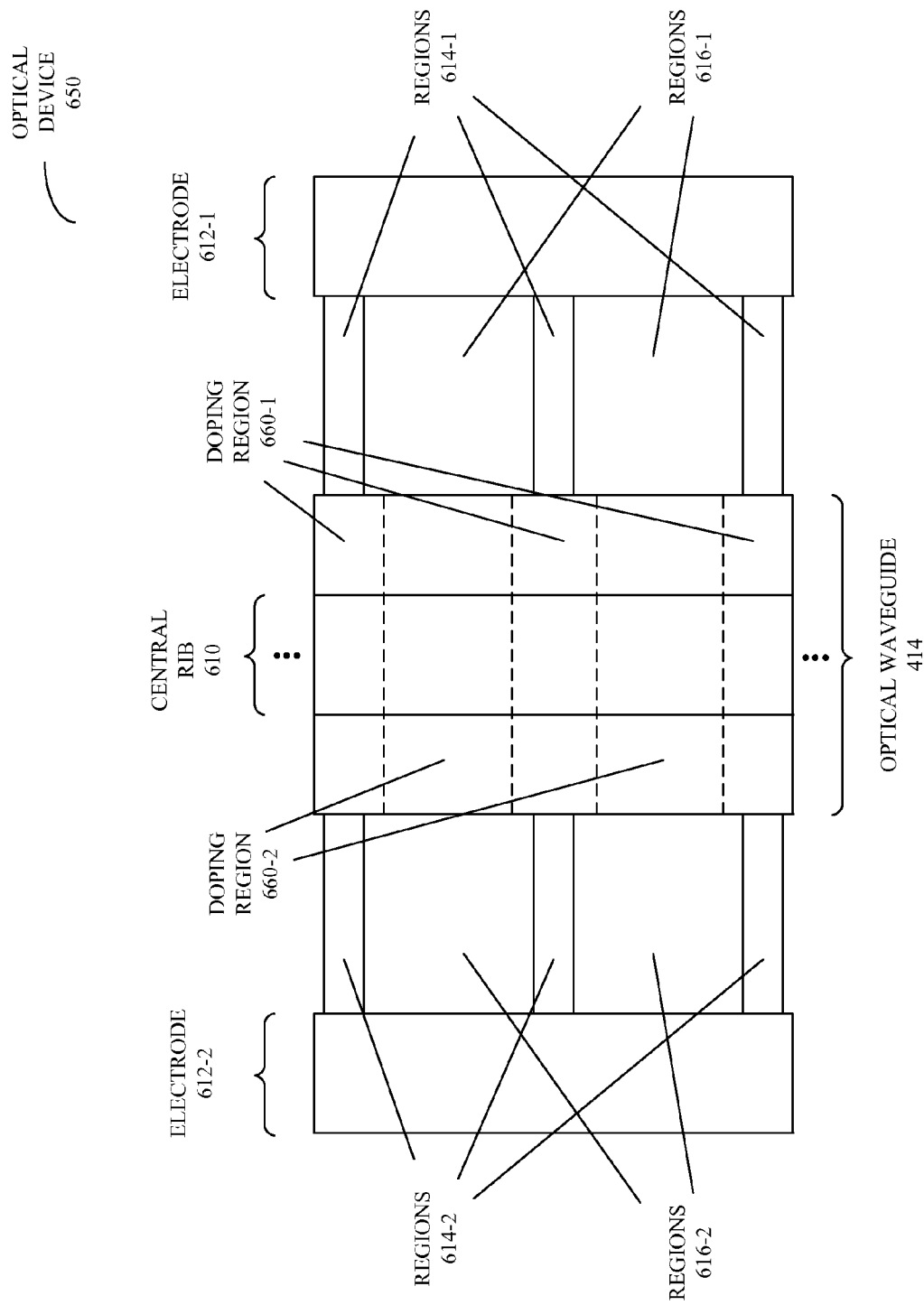
FIG. 6B is a block diagram illustrating a tunable optical device in accordance with an embodiment of the present invention.

As shown in FIG. 6B, which presents a block diagram illustrating a top view of a tunable optical device 650, in some embodiments, the doping of the semiconductor layer in the optical waveguide 414 alternates between a first type of doping region 660-1 and a second type of doping region 660-2, where the doping in the first type of doping region 660-1 is higher than in the second type of doping region 660-2. For example, the first type of doping region 660-1 may be doped and the second type of doping region 660-2 may be un-doped. This alternative doping profile reduces optical losses in the optical waveguide, and may reduce heat dissipation along the second path. In addition, central rib 610 may be un-doped or lightly doped.

Figure 7A:
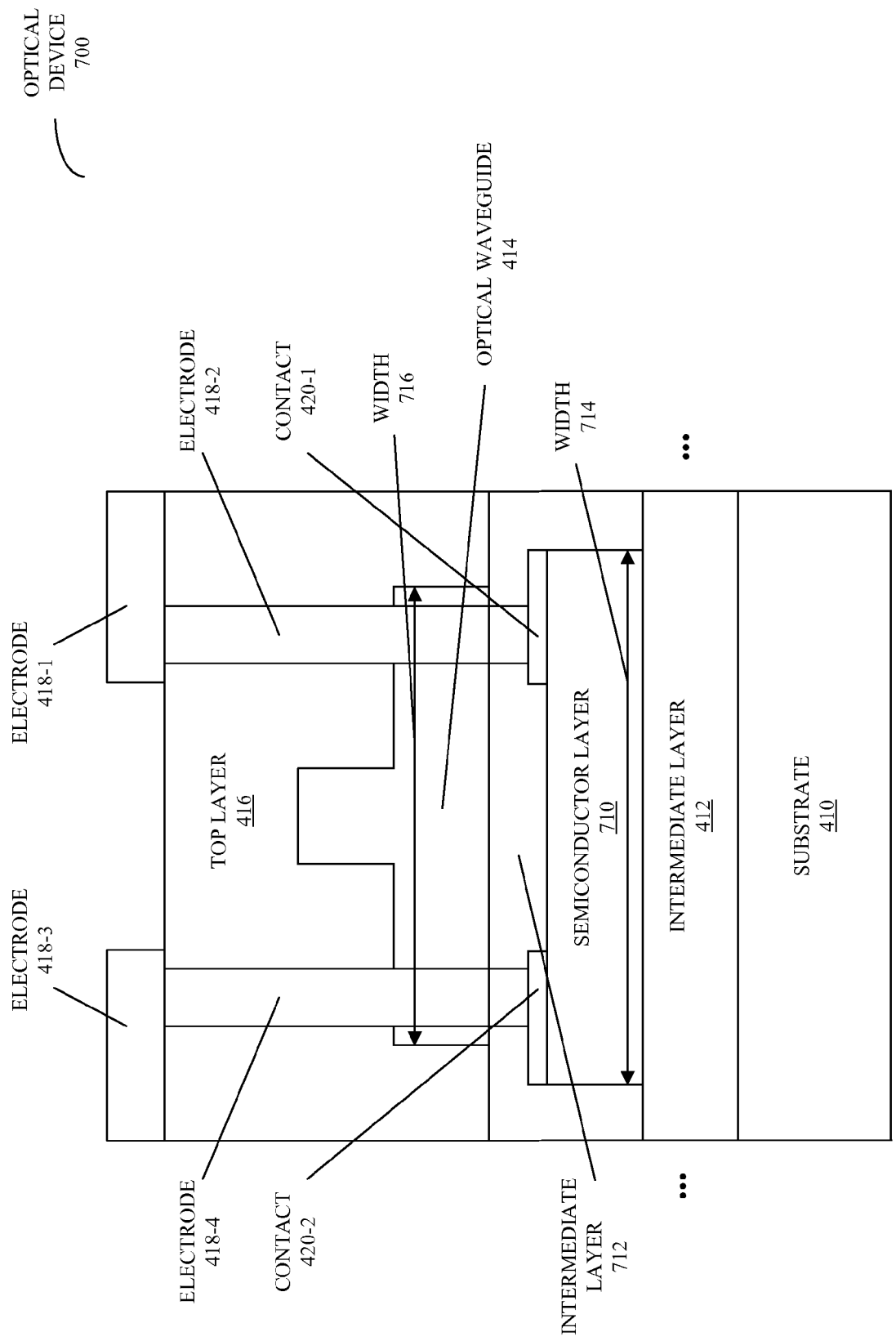
FIG. 7A is a block diagram illustrating a tunable optical device in accordance with an embodiment of the present invention.

In a variation on the preceding embodiments, the heater may be implemented in a separate layer from the optical waveguide 414, for example, using a dual SOI technology. This is shown in FIG. 7A, which presents a block diagram illustrating a cross-sectional view of a tunable optical device 700. In this device, a heater (such as heater 124 in FIG. 1) is implemented in semiconductor layer 710 (such as silicon), which is separated from the optical waveguide 414 by intermediate layer 712. (Alternatively, semiconductor layer 710 may be a conductive polymer or a dielectric, such as silicon nitride.) For example, the heater may be implemented by doping semiconductor layer 710 to $10^{18}/cm^3$ underneath the optical waveguide 414 to $10^{18}/cm^3$. Note that intermediate layer 712 may be an electrical insulator which is 0.5 µm thick, and which is a dielectric material with low thermal conductivity (such as silicon dioxide).

This spatial separation of functionality may combine the advantages of direct heating and indirect heating. In particular, optical waveguide 414 and intermediate layer 712 in optical device 700 may provide efficient optical confinement with reduced free-carrier optical losses. In addition, additional functions may be implemented in the optical waveguide 414. Note that heat transfer between the heater in semiconductor layer 710 and the optical waveguide 414 may occur via electrodes 418, which is very efficient. For example, heat transfer may be mediated by a portion of electrodes 418 in vias in intermediate layer 712. Moreover, heat transfer between the heater in semiconductor layer 710 and the substrate 410 may be reduced by intermediate layer 412.

Furthermore, a width 714 of the heater in semiconductor layer 710 may be wider than a width 716 of the optical waveguide 414. This geometric configuration may facilitate heat transfer between the heater and the optical waveguide 414. Consequently, power consumption by the heater in optical device 700 may be less than 10-20 mW for a 180° phase shift in the optical waveguide 414.

Figure 7B:
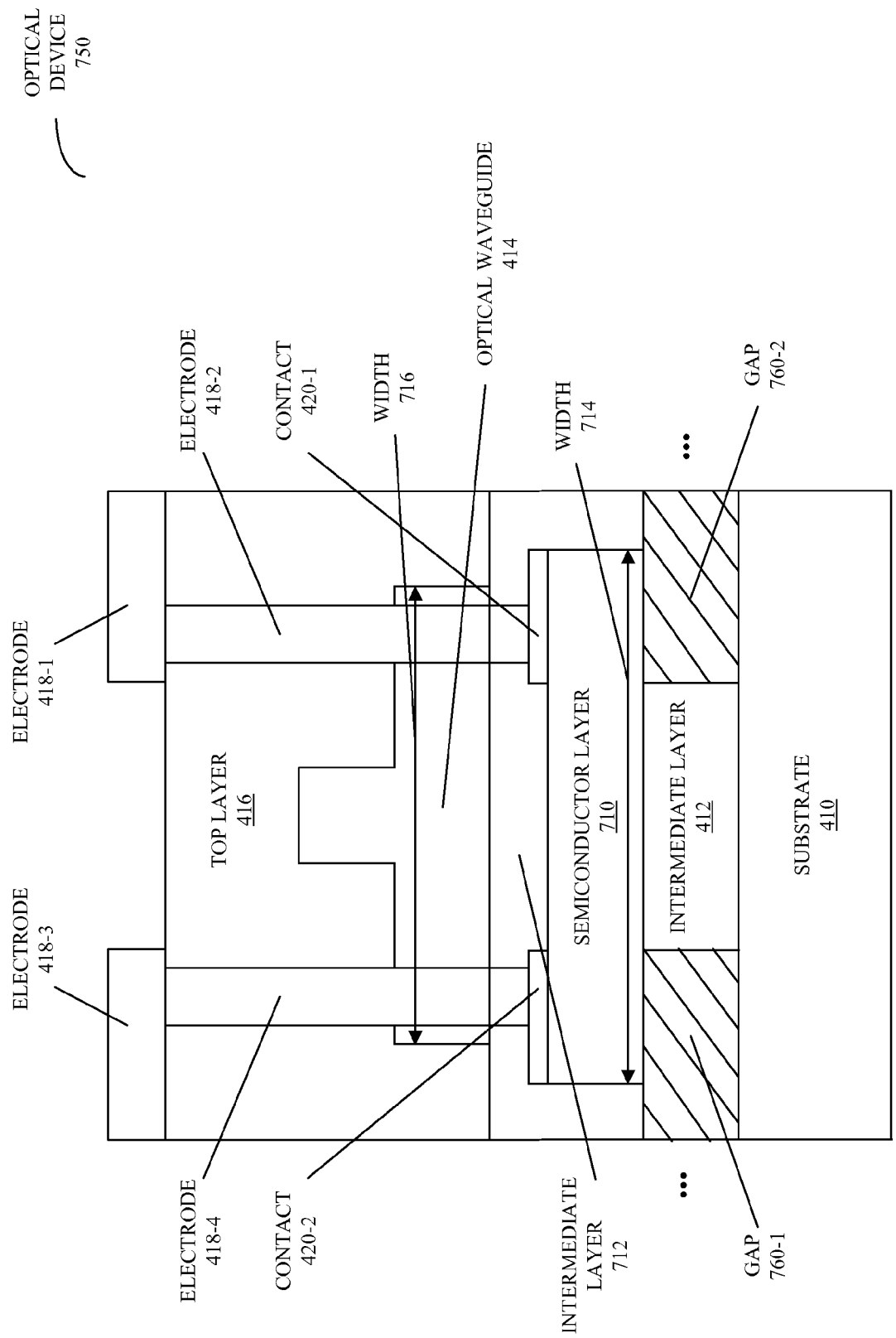
FIG. 7B is a block diagram illustrating a tunable optical device in accordance with an embodiment of the present invention.

Heat transfer to the substrate 410 may be further reduced by undercutting intermediate layer 412 (using the technique shown in FIG. 1). This is shown in FIG. 7B, which presents a block diagram illustrating a cross-sectional view of a tunable optical device 750. In particular, there may be gaps 760 in the intermediate layer 412 underneath at least a portion of the heater in semiconductor layer 710. Note that the undercut etching can be performed after the ohmic contacts are formed and intermediate layer 712 is protected by surrounding metal walls.

Figure 8:
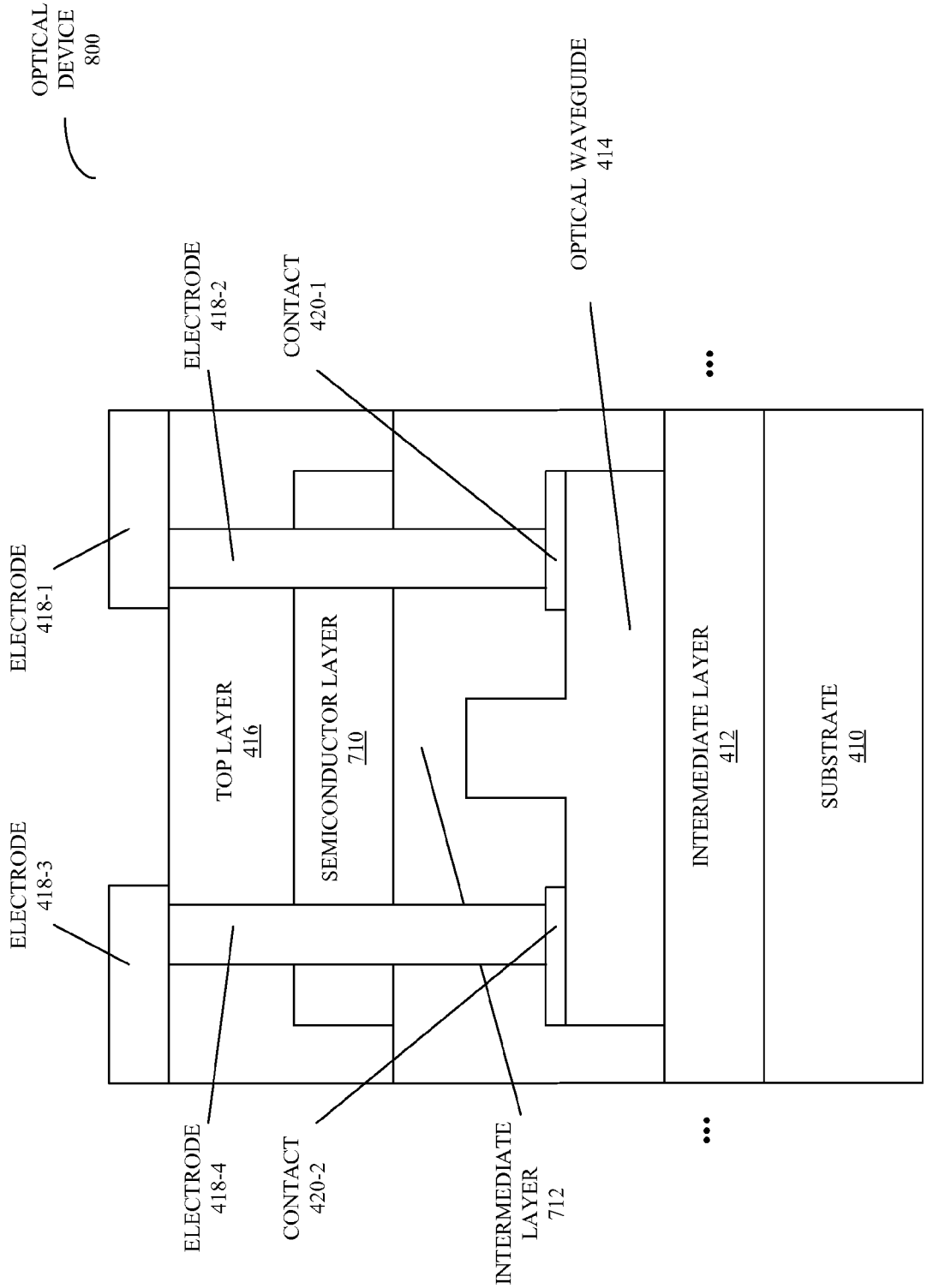
FIG. 8 is a block diagram illustrating a tunable optical device in accordance with an embodiment of the present invention.

In some embodiments, the vertical order of semiconductor layer 710 and the optical waveguide 414 are reversed. This is shown in FIG. 8, which presents a block diagram illustrating a cross-sectional view of a tunable optical device 800. In these embodiments, semiconductor layer 710 may include polysilicon or amorphous silicon.

Optical devices 100 (FIG. 1), 200 (FIG. 2), 300 (FIG. 3A), 350 (FIG. 3B), 400 (FIG. 4), 500 (FIG. 5), 600 (FIG. 6), 700 (FIG. 7A), 750 (FIG. 7B) and/or 800 may include fewer components or additional components. Moreover, although these optical devices are illustrated as having a number of discrete items, FIGS. 1-8 are intended to be functional descriptions of the various features that may be present rather than structural schematics of the embodiments described herein. Consequently, in these embodiments, two or more components may be combined into a single component, and/or a position of one or more components may be changed.

A wide variety of fabrication techniques may be used to fabricate the optical devices in FIGS. 1-8, as known to one of skill in the art. In addition, while the preceding embodiments illustrate single instances of an optical device, any of the preceding embodiments may be implemented in an array that includes multiple instances.

Note that embodiments of the optical device can also be used when the optical waveguide is electrically tuned. In these embodiments, it is still important that the optical waveguide be thermally isolated from its external environment.

One or more of these optical devices may be included in a multi-chip module (MCM) (such as a switch or a processor) and/or in a system that include the MCM. This MCM may include an array of chip modules (CMs) or single-chip modules (SCMs), and a given SCM may include at least one semiconductor die. Note that the MCM is sometimes referred to as a 'macro-chip.' Furthermore, the semiconductor die may communicate with other semiconductor dies, CMs, SCMs, and/or devices in the MCM using proximity communication of electromagnetically coupled signals (which is referred to as 'electromagnetic proximity communication'), such as capacitively coupled signals and/or proximity communication of optical signals (which are, respectively, referred to as 'electrical proximity communication' and 'optical proximity communication'). In some embodiments, the electromagnetic proximity communication includes inductively coupled signals and/or conductively coupled signals.

Embodiments of the MCM may be used in a variety of applications, including: VLSI circuits, telephony, storage area networks, data centers, networks (such as local area networks), and/or computer systems (such as multiple-core processor computer systems). For example, the MCM may be included in a backplane that is coupled to multiple processor blades, or the MCM may couple different types of components (such as processors, memory, I/O devices, and/or peripheral devices). In some embodiments, the MCM performs the functions of: a switch, a hub, a bridge, and/or a router.

Note that the computer systems may include, but are not limited to: a server, a laptop computer, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer system may be at one location or may be distributed over multiple, geographically dispersed locations.

Figure 9:
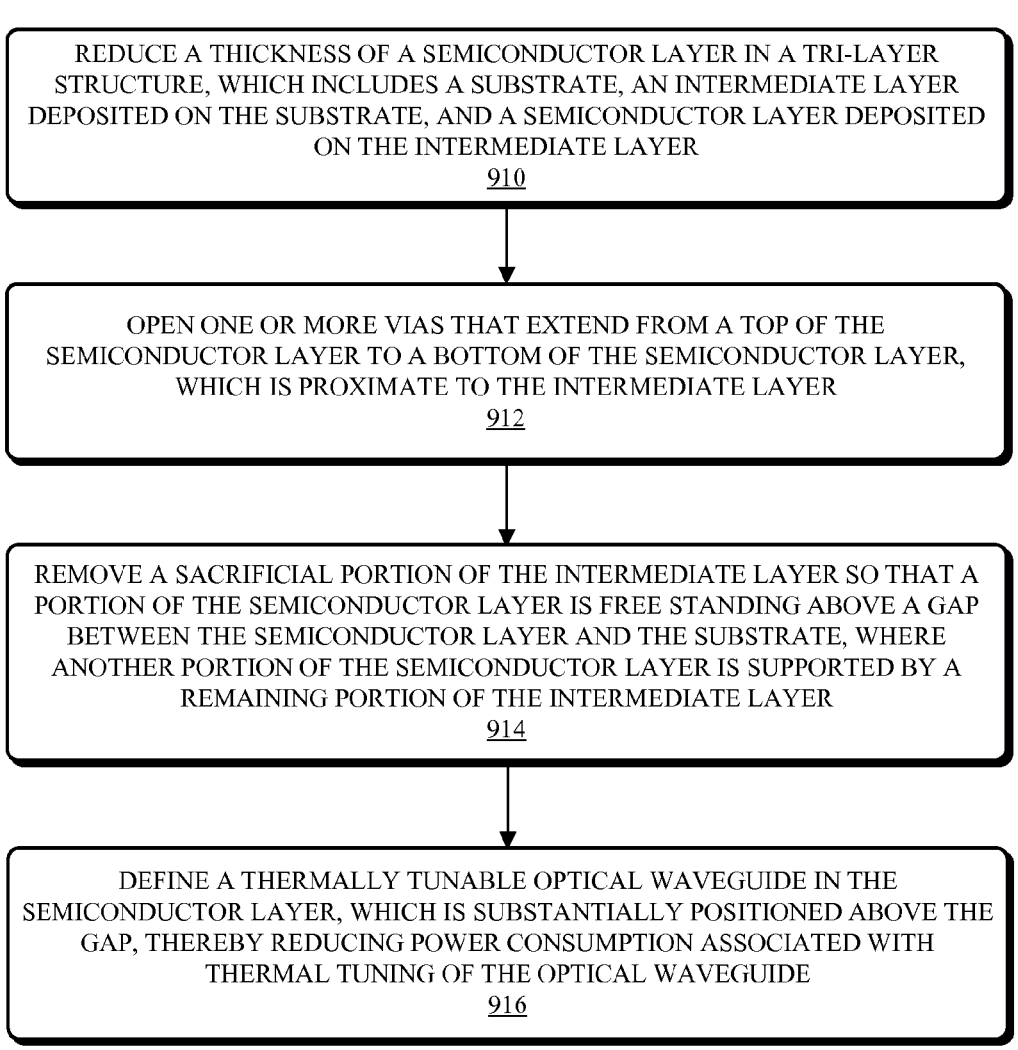
FIG. 9 is a flow chart illustrating a process for fabricating an optical device in accordance with an embodiment of the present invention.

We now describe embodiments of a process for fabricating an optical device, such as optical device 100 (FIG. 1). FIG. 9 presents a flow chart illustrating a process 900 for fabricating an optical device. During this process, a thickness of a semiconductor layer in a tri-layer structure, which includes a substrate, an intermediate layer deposited on the substrate, and a semiconductor layer deposited on the intermediate layer, is reduced (910). Then, one or more vias that extend from a top of the semiconductor layer to a bottom of the semiconductor layer, which is proximate to the intermediate layer, are opened (912). Next, a sacrificial portion of the intermediate layer is removed so that a portion of the semiconductor layer is free standing above a gap between the semiconductor layer and the substrate (914). Note that another portion of the semiconductor layer is supported by a remaining portion of the intermediate layer. Moreover, a thermally tunable optical waveguide in the semiconductor layer, which is substantially positioned above the gap, is defined (916), thereby reducing power consumption associated with thermal tuning of the optical waveguide.

In some embodiments of process 900, there may be additional or fewer operations. Moreover, the order of the operations may be changed, and/or two or more operations may be combined into a single operation.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An optical device, comprising:
a substrate;
an intermediate layer deposited on the substrate; and
a semiconductor layer, deposited on the intermediate layer, that includes a thermally tunable optical waveguide and a via that extends from a top of the semiconductor layer to a bottom of the semiconductor layer which is proximate to the intermediate layer;
wherein a portion of the semiconductor layer is free standing above a gap between the semiconductor layer and the substrate, wherein the gap corresponds to a removed sacrificial portion of the intermediate layer which is accessible through the via, and wherein air is at least partially removed from the gap;
wherein another portion of the semiconductor layer is supported by a remaining portion of the intermediate layer; and
wherein the gap increases thermal impedance between the semiconductor layer and the substrate, thereby reducing power consumption associated with thermal tuning of the optical waveguide.

2. The optical device of claim 1, wherein the substrate includes silicon.

3. The optical device of claim 1, wherein the intermediate layer includes an oxide.

4. The optical device of claim 3, wherein the oxide includes silicon dioxide.

5. The optical device of claim 1, wherein the substrate, the intermediate layer and the semiconductor layer comprise a silicon-on-insulator technology.

6. The optical device of claim 1, further comprising a heater defined in the semiconductor layer.

7. The optical device of claim 6, wherein the heater includes a passive resistor or an active device.

8. The optical device of claim 1, further comprising an electrical coupling between the semiconductor layer and a power-supply contact through a bridge over the gap.

9. The optical device of claim 1, wherein an electrical coupling between the semiconductor layer and a power-supply contact occurs in the remaining portion of the intermediate layer.

10. The optical device of claim 1, further comprising a heater, which is in or proximate to the optical waveguide, and which is used to thermally tune the optical waveguide, wherein power consumption by the heater is less than 20 mW for a 180° phase shift in the optical waveguide.

11. The optical device of claim 1, wherein the optical waveguide is included in: an optical filter, an optical multiplexer or an optical de-multiplexer.

12. The optical device of claim 1, further comprising a seal positioned in the via, wherein the seal is configured to seal the gap to prevent entry of air into the gap through the via.

13. An array of multiple instances of an optical device, wherein a given instance of the optical device comprises:
a substrate;
an intermediate layer deposited on the substrate; and
a semiconductor layer, deposited on the intermediate layer, that includes a thermally tunable optical waveguide and a via that extends from a top of the semiconductor layer to a bottom of the semiconductor layer which is proximate to the intermediate layer;
wherein a portion of the semiconductor layer is free standing above a gap between the semiconductor layer and the substrate, wherein the gap corresponds to a removed sacrificial portion of the intermediate layer which is accessible through the via, and wherein air is at least partially removed from the gap;
wherein another portion of the semiconductor layer is supported by a remaining portion of the intermediate layer; and
wherein the gap increases thermal impedance between the semiconductor layer and the substrate, thereby reducing power consumption associated with thermal tuning of the optical waveguide.

14. The array of optical devices of claim 13, wherein the gap increases thermal impedance to other instances of the optical device.

15. The array of optical devices of claim 13, wherein the substrate, the intermediate layer and the semiconductor layer comprise a silicon-on-insulator technology.

16. The array of optical devices of claim 13, further comprising a heater defined in the semiconductor layer.

17. The array of optical devices of claim 16, wherein the heater facilitates a programmable temperature in the given instance of the optical device, which can be different from the temperature in one or more other instances of the optical device.

18. The array of optical devices of claim 13, further comprising a heater, which is in or proximate to the optical waveguide, and which is used to thermally tune the optical waveguide, wherein power consumption by the heater is less than 20 mW for a 180° phase shift in the optical waveguide.

19. A method for fabricating an optical device, comprising:
reducing a thickness of a semiconductor layer in a tri-layer structure, which includes a substrate, an intermediate layer deposited on the substrate, and a semiconductor layer deposited on the intermediate layer;
opening a via that extends from a top of the semiconductor layer to a bottom of the semiconductor layer which is proximate to the intermediate layer;
removing a sacrificial portion of the intermediate layer so that a portion of the semiconductor layer is free standing above a gap between the semiconductor layer and the substrate, wherein another portion of the semiconductor layer is supported by a remaining portion of the intermediate layer;
at least partially removing air from the gap; and
defining a thermally tunable optical waveguide in the semiconductor layer, which is substantially positioned above the gap, thereby reducing power consumption associated with thermal tuning of the optical waveguide.

20. The method of claim 19, wherein the method further comprises sealing the via to prevent entry of air into the gap through the via.

* * * * *